(12) United States Patent
Ho et al.

(10) Patent No.: US 9,974,203 B1
(45) Date of Patent: May 15, 2018

(54) RACK SYSTEM FOR SUPPORTING A COMPUTING DEVICE

(71) Applicant: NetApp Inc., Sunnyvale, CA (US)

(72) Inventors: Dan Chau Ho, Fremont, CA (US); Hoa Van Pham, San Jose, CA (US)

(73) Assignee: NETAPP INC., Sunnyvale, CA (US)

( * ) Notice: Subject to any disclaimer, the term of this patent is extended or adjusted under 35 U.S.C. 154(b) by 15 days.

(21) Appl. No.: 15/349,994

(22) Filed: Nov. 11, 2016

(51) Int. Cl.
*A47F 7/00* (2006.01)
*H05K 7/14* (2006.01)
*H05K 7/18* (2006.01)

(52) U.S. Cl.
CPC .......... *H05K 7/1489* (2013.01); *H05K 7/183* (2013.01)

(58) Field of Classification Search
CPC .............................. H05K 7/1489; H05K 7/183
USPC .......... 211/26, 206; 312/265.1–265.4, 223.1, 312/334.4, 334.5; 248/298.1, 316.8
See application file for complete search history.

(56) References Cited

U.S. PATENT DOCUMENTS

| | | | |
|---|---|---|---|
| 2,809,086 A * | 10/1957 | Fall ...................... | H05K 7/1421 126/340 |
| 5,474,378 A * | 12/1995 | Smith ................... | A47L 15/504 248/297.31 |
| 5,695,265 A | 12/1997 | Hoffman | |
| 5,791,498 A * | 8/1998 | Mills ....................... | H02B 1/34 211/183 |
| 6,422,399 B1 * | 7/2002 | Castillo ................... | A47B 57/40 211/175 |
| 6,578,939 B1 | 6/2003 | Mayer | |
| 6,615,992 B1 * | 9/2003 | Lauchner ................ | A47B 88/43 211/175 |
| 6,659,577 B2 | 12/2003 | Lauchner | |
| 6,681,942 B2 | 1/2004 | Haney | |
| 6,702,412 B2 * | 3/2004 | Dobler ................... | A47B 88/407 312/205 |
| 6,749,275 B2 * | 6/2004 | Cutler .................... | A47B 88/43 248/243 |
| 6,773,080 B2 * | 8/2004 | Chen ...................... | A47B 57/40 211/26 |
| 6,863,188 B2 * | 3/2005 | Besserer ................ | A47B 88/43 211/175 |
| 6,929,336 B2 * | 8/2005 | Liu ....................... | H05K 7/1421 312/223.1 |
| 7,144,184 B1 | 12/2006 | Tsai | |
| 7,694,926 B2 | 4/2010 | Allen et al. | |
| 7,703,734 B2 | 4/2010 | Chen et al. | |

(Continued)

*Primary Examiner* — Joshua J Michener
*Assistant Examiner* — Devin K Barnett
(74) *Attorney, Agent, or Firm* — Cooper Legal Group, LLC

(57) ABSTRACT

A rack system for supporting a computing device includes an adaptor. The adaptor includes a first support portion defining an opening that is aligned with a rack opening of a rack support post. The first support portion and the rack support post receive a fastener through the opening and the rack opening to attach the adaptor to the rack support post. A second support portion is attached to an end of the first support portion. The second support portion includes a first wall and a second wall that are spaced apart to define a flange opening. A support arm includes a flange having a body portion and an attachment portion. The attachment portion is received within the flange opening to attach the support arm to the adaptor. A rail is attached to the body portion of the flange. The support arm is attached to the rack support post, via the adaptor.

3 Claims, 10 Drawing Sheets

(56) References Cited

U.S. PATENT DOCUMENTS

| | | | | |
|---|---|---|---|---|
| 7,950,753 B2* | 5/2011 | Liang | A47B 88/43 | 211/26 |
| 7,988,246 B2* | 8/2011 | Yu | A47B 88/43 | 211/175 |
| 8,028,965 B2 | 10/2011 | Chen et al. | | |
| 8,322,668 B2* | 12/2012 | Tang | H05K 7/1489 | 211/175 |
| 8,562,086 B1 | 10/2013 | Baik et al. | | |
| 8,807,351 B2* | 8/2014 | Lin | A47B 88/43 | 211/26 |
| 2001/0040203 A1* | 11/2001 | Brock | H02B 1/34 | 248/222.11 |
| 2002/0195408 A1* | 12/2002 | Hegrenes | H05K 7/183 | 211/26 |
| 2004/0079712 A1* | 4/2004 | Mayer | A47B 57/485 | 211/26 |
| 2004/0089779 A1* | 5/2004 | Greenwald | A47B 88/43 | 248/241 |
| 2004/0094492 A1* | 5/2004 | Greenwald | A47B 88/43 | 211/26 |
| 2004/0104184 A1* | 6/2004 | Hartman | G06F 1/183 | 211/26 |
| 2004/0159618 A1* | 8/2004 | Nguyen | G06F 1/183 | 211/26 |
| 2004/0217073 A1* | 11/2004 | Dobler | H05K 7/1421 | 211/26 |
| 2005/0285492 A1* | 12/2005 | Hu | A47B 88/43 | 312/334.4 |
| 2005/0285493 A1* | 12/2005 | Hu | A47B 88/43 | 312/334.4 |
| 2006/0283816 A1* | 12/2006 | Moore | A47B 45/00 | 211/26 |
| 2008/0067907 A1* | 3/2008 | Chen | A47B 88/43 | 312/312 |
| 2008/0087781 A1* | 4/2008 | Chen | A47B 88/43 | 248/224.8 |
| 2008/0230496 A1* | 9/2008 | Henderson | H05K 7/1489 | 211/26 |
| 2008/0296455 A1* | 12/2008 | Brock | A47B 96/06 | 248/298.1 |
| 2009/0114785 A1* | 5/2009 | Huang | A47B 88/43 | 248/220.31 |
| 2009/0166485 A1* | 7/2009 | Chen | A47B 88/43 | 248/200 |
| 2009/0167127 A1* | 7/2009 | Chen | A47B 88/43 | 312/334.1 |
| 2009/0219701 A1* | 9/2009 | Wu | H05K 7/1494 | 361/727 |
| 2010/0032389 A1* | 2/2010 | Du | H05K 7/1489 | 211/26 |
| 2010/0033926 A1* | 2/2010 | Du | A47B 88/49 | 361/679.58 |
| 2010/0200523 A1* | 8/2010 | Henderson | H05K 7/1489 | 211/26 |
| 2010/0243586 A1* | 9/2010 | Henderson | H05K 7/1489 | 211/26.2 |
| 2010/0314337 A1* | 12/2010 | Yang | H05K 7/1489 | 211/26 |
| 2010/0327135 A1* | 12/2010 | Selvidge | A47B 96/06 | 248/221.11 |
| 2011/0181161 A1* | 7/2011 | Hsiao | H05K 7/18 | 312/223.1 |
| 2011/0226710 A1* | 9/2011 | Peng | H05K 7/1489 | 211/26 |
| 2012/0074281 A1* | 3/2012 | Chen | H05K 7/1421 | 248/224.8 |
| 2014/0086665 A1 | 3/2014 | Baik et al. | | |
| 2015/0048041 A1* | 2/2015 | Chuang | H05K 7/1489 | 211/175 |
| 2015/0181753 A1* | 6/2015 | Murakami | H05K 7/1489 | 211/26 |
| 2016/0128221 A1* | 5/2016 | Butterbaugh | H05K 7/1492 | 211/26 |

* cited by examiner

RACK SYSTEM FOR SUPPORTING A COMPUTING DEVICE

BACKGROUND

Rack systems may be provided for supporting equipment, such as a computing device (e.g., computers, servers, routers, or the like). Rack systems may include vertical rack support posts and horizontal support arms. The vertical rack support posts may comprise one or more apertures to allow for attaching the horizontal support arms to the vertical rack support posts. Equipment can then be stored in the rack system by resting upon the horizontal support arms.

FIGURES

The application is illustrated by way of example and not limitation in the figures of the accompanying drawings, in which like references generally indicate similar elements and in which.

DESCRIPTION

Figure 1:
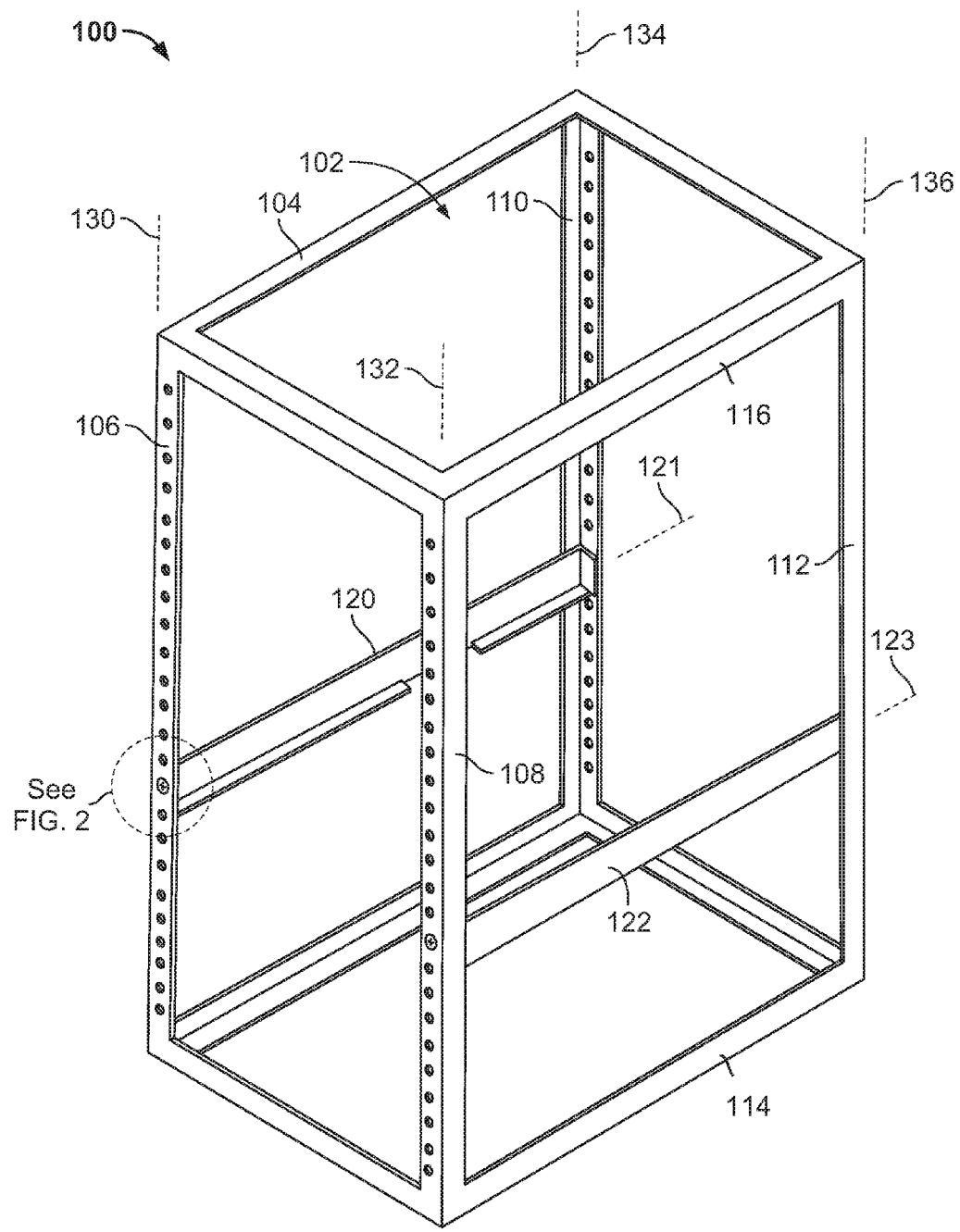
FIG. 1 illustrates an example rack system for supporting a computing device.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are illustrated in block diagram form in order to facilitate describing the claimed subject matter.

In rack systems, vertical rack support posts may define one or more apertures or openings to allow for attaching horizontal support arms to the vertical rack support posts, such as via fasteners and/or protrusions on the horizontal support arms. However, some support arms may not mate well with some rack support posts (e.g., where a support arm is produced by a different manufacturer than the manufacturer of a rack support post). For example, the rack support post may have apertures that are a particular size and/or shape (e.g., square) whereas the support arm may be configured to mate with apertures having a different size and/or shape (e.g., round).

To address at least these problems, a rack system is provided in which an adaptor can be removably attached to a vertically extending rack support post. Regardless of the size and/or shape of the openings in the rack support post, the adaptor can be attached to the rack support post via fasteners. A horizontally extending support arm can be attached to the adaptor, such as by a mechanical locking configuration. In this way, the horizontally extending support arm can be attached to the vertically extending rack support post via the adaptor, regardless of the shape of the openings in the rack support post.

According to an aspect, a rack system for supporting a computing device is provided. The rack system comprises an adaptor that is configured to attach a support arm to a rack support post of a rack. The adaptor comprises a first support portion extending parallel to the rack support post. The first support portion defines an opening that is aligned with a rack opening of the rack support post. The first support portion and the rack support post are configured to receive a fastener through the opening and the rack opening to attach the adaptor to the rack support post. The adaptor comprises a second support portion attached to an end of the first support portion. The second support portion comprises a first wall and a second wall that are spaced apart to define a flange opening. The flange opening is configured to receive an attachment portion of the support arm. The support arm is attached to the rack support post, via the adaptor, when the adaptor is attached to the rack support post and the attachment portion is received within the flange opening. The rack system is configured to support the computing device when the support arm is attached to the rack support post. It will be appreciated that although regarded as the rack system, the rack system may merely comprise the adaptor (e.g., which is removably attachable to a rack support post)

According to another aspect, a rack system for supporting a computing device is provided. The rack system comprises a support arm configured to be attached to a rack support post of a rack via an adaptor. The support arm comprises a flange comprising a body portion and an attachment portion attached to an end of the body portion. The attachment portion comprises a first attachment wall extending non-parallel to the body portion. A second attachment wall extends non-parallel to the first attachment wall. The second attachment wall is spaced apart from the body portion to define an attachment opening. The attachment portion is configured to be received within a flange opening of the adaptor such that a portion of the adaptor is disposed within the attachment opening between the second attachment wall of the flange and the body portion of the flange. A rail is configured to be attached to the body portion of the flange. The support arm is attached to the rack support post, via the adaptor, when the attachment portion is received within the flange opening. The rack system is configured to support the computing device when the support arm is attached to the rack support post. It will be appreciated that although regarded as the rack system, the rack system may merely comprise the support arm.

According to another aspect, a rack system for supporting a computing device is provided. The rack system comprises an adaptor comprising a first support portion defining an opening that is aligned with a rack opening of a rack support post of a rack. The first support portion and the rack support post are configured to receive a fastener through the opening and the rack opening to attach the adaptor to the rack support post. A second support portion is attached to an end of the first support portion. The second support portion comprises a first wall and a second wall that are spaced apart to define a flange opening. A support arm comprises a flange comprising a body portion and an attachment portion. The attachment portion is configured to be received within the flange opening of the second support portion to attach the support arm to the adaptor. A rail is configured to be attached to the body portion of the flange. The support arm is attached to the rack support post, via the adaptor, when the adaptor is attached to the rack support post and the attachment portion is received within the flange opening. The rack system is configured to support the computing device when the support arm is attached to the rack support post. It will be appreciated that although regarded as the rack system, the rack system may merely comprise the adaptor and the support arm.

According to another aspect, a method for supporting a computing device with a rack system is provided. The method comprises positioning an adaptor relative to a rack support post of a rack extending along a first axis and defining a rack opening such that an opening defined within the adaptor is aligned with the rack opening of the rack support post. The method comprises attaching the adaptor to the rack support post by inserting a fastener through the opening of the adaptor and the rack opening of the rack support post. The adaptor extends along a second axis that is parallel to the first axis. The method comprises attaching a support arm to the adaptor by inserting an attachment portion of the support arm into a flange opening of the adaptor such that the support arm is attached to the rack support post via the adaptor. The rack system supports the computing device when the support arm is attached to the rack support post. The support arm extends along a third axis that is perpendicular to the first axis.

Referring to FIG. 1, a rack system 100 for supporting a computing device is illustrated. In an example, the rack system 100 may define a substantially hollow interior 102 into which the computing device is received. The computing device may comprise, for example, computers, servers, routers, storage controller and storage arrays, as well as other types of electronic devices. The computing device may, for example, rest upon or be supported by horizontal support arms of the rack system.

The rack system 100 comprises a rack 104 that defines the hollow interior 102. In an example, the rack 104 may comprise, for example, a first rack support post 106, a second rack support post 108, a third rack support post 110, and a fourth rack support post 112. The first rack support post 106, the second rack support post 108, the third rack support post 110, and the fourth rack support post 112 may be spaced apart in a quadrilateral configuration (e.g., rectangular, square, etc.). In an example, the rack 104 (e.g., the rack support posts) may extend vertically between a bottom rack support post 114 and a top rack support post 116.

The rack system 100 comprises one or more support arms that extend between adjacent rack support posts. For example, an extendable support arm 120 may extend between the first rack support post 106 and the third rack support post 110. A second extendable support arm 122 may extend between the second rack support post 108 and the fourth rack support post 112. In an example, the support arm 120 and the second support arm 122 may extend substantially parallel to one another. The support arm 120 and the second support arm 122 may extend along sides of the hollow interior 102.

In an example, the rack support posts 106, 108, 110, 112 may extend along axes that are substantially parallel to one another. For example, the first rack support post 106 may extend along a first rack axis 130. Other rack support posts (e.g., 108, 110, 112) may similarly extend along other rack axes (e.g., 132, 134, 136) where at least two of the rack axes (e.g., 130, 132, 134, 136) may be parallel to one another. The support arms 120, 122 may similarly extend along axes (e.g., 121, 123) that may be parallel to one another but perpendicular to at least one of the rack axes (e.g., 130, 132, 134, 136).

Figure 2:
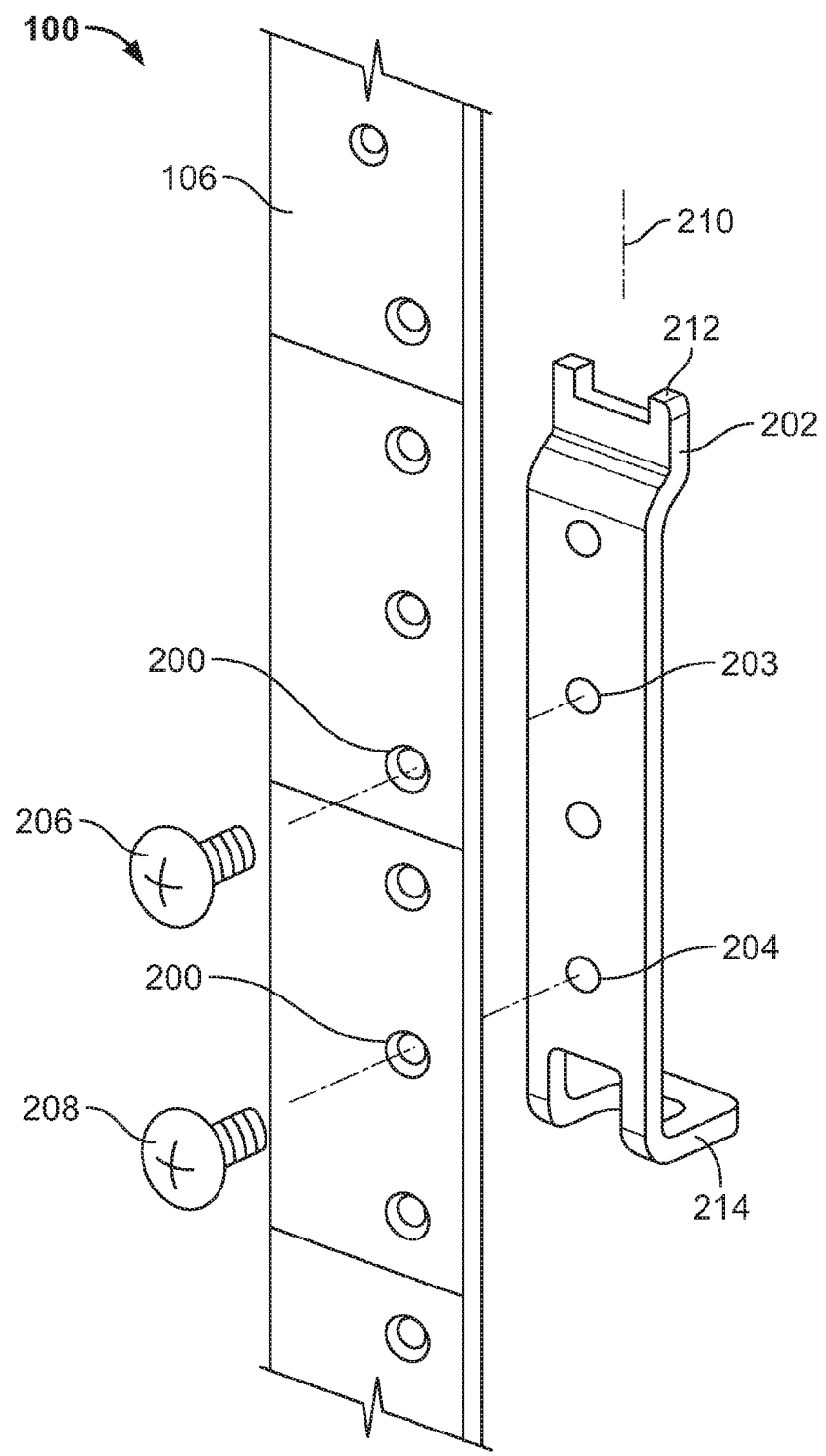
FIG. 2 illustrates an example adaptor and a portion of a rack support post.

Referring to FIG. 2, a portion of the rack system 100 is illustrated, in particular a junction in which the support arm 120 (FIG. 1) may engage the first rack support post 106. For simplicity, the support arm 120 is not illustrated in FIG. 2, though, in other examples, the support arm 120 may be attached to the first rack support post 106.

The first rack support post 106 comprises one or more rack openings or apertures 200. In an example, the rack openings 200 may be arranged vertically at least partially along a length of the first rack support post 106. While any number of shapes for the rack openings 200 are envisioned, in an example, the rack openings 200 may have a circular shape. It will be appreciated that the other rack support posts (e.g., the second rack support post 108, the third rack support post 110, and the fourth rack support post 112) may have similar or different openings to the rack openings 200.

The rack system 100 comprises the rack 104 to which an adaptor 202 can be coupled. The adaptor 202 is configured to attach the support arm 120 (e.g., illustrated in FIG. 1) to the first rack support post 106 of the rack 104. In an example, the adaptor 202 defines one or more openings that may be spaced apart a substantially similar distance as at least some of the rack openings 200. In an example, the adaptor 202 defines a plurality of openings, such a first opening 203, a second opening 204, etc. In an aspect, the adaptor 202 defines only one opening. The adaptor 202 may be positioned adjacent to and/or in contact with the first rack support post 106. In this way, the opening 203 and the second opening 204 of the adaptor 202 are aligned with the rack openings 200 of the first rack support post 106 to receive fasteners therethrough. In an example, one or more fasteners (e.g., a first fastener 206, a second fastener 208, etc.) may be received through the opening 203 and the second opening 204 of the adaptor 202 and through the rack openings 200 of the first rack support post 106 to couple and secure the adaptor 202 to the first rack support post 106 of the rack 104. It will be appreciated that one or more fasteners couple the adaptor 202 to the first rack support post 106. In an aspect shown in FIG. 2 the first fastener 206 and the second fastener 208 comprise removable screws. However, it should be noted that any type of fasteners, such as bolts, rivets, or other types of mechanical locking structures can be used to couple and secure the adaptor 202 to the first rack support post 106.

The adaptor 202 extends along a second axis 210 between a first end 212 and a second end 214 of the adaptor 202. In an example, the second axis 210 can be substantially parallel to the first rack axis 130 along which the first rack support post 106 of the rack 104 extends when the adaptor 202 is attached to the first rack support post 106.

Figure 3:
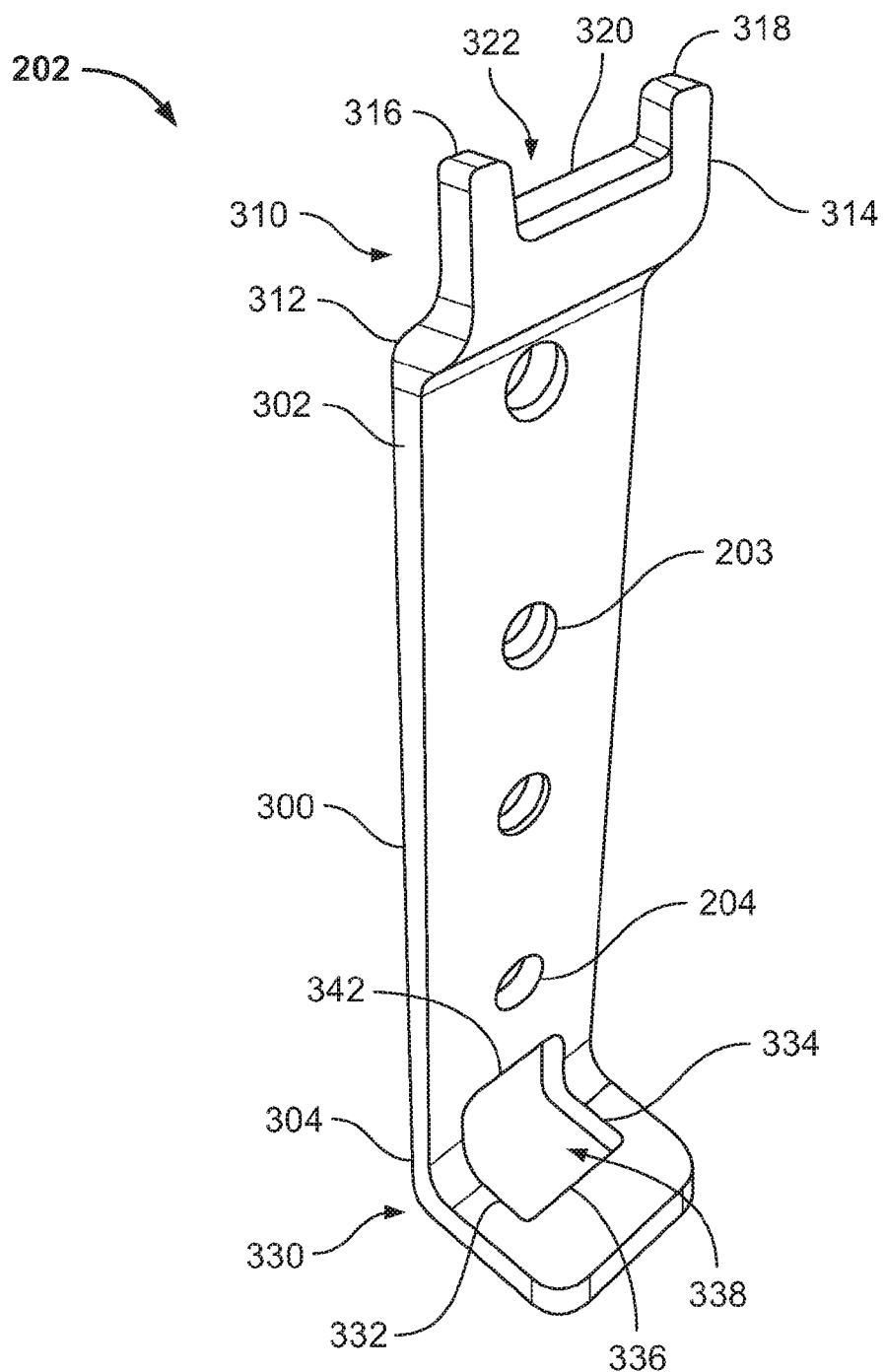
FIG. 3 illustrates an example adaptor.

Referring to FIGS. 2 and 3, the adaptor 202 comprises a first support portion 300. The first support portion 300 may be positioned to extend vertically parallel to the first rack support post 106 of the rack 104. In an example, the first support portion 300 extends along an axis between a first end 302 and a second end 304. The first support portion 300 may define the opening 203 and the second opening 204 that are aligned with the rack opening 200 of the first rack support post 106 of the rack 104. In an example, the first support portion 300 defines a substantially flat/planar wall. The first support portion 300 and the first rack support post 106 of the rack 104 may receive the first fastener 206 and the second fastener 208 through the openings 200, 203, 204 to couple the first support portion 300 to the first rack support post 106. In this way, the first support portion 300 may be adjacent to and in contact with the first rack support post 106.

The adaptor 202 comprises a second support portion 310. The second support portion 310 may be attached to an end (e.g., the first end 302) of the first support portion 300. It will be appreciated that, as used herein, by being attached, the first support portion 300 and the second support portion 310 are not limited to comprising two separate structures that are attached. Rather, in an example, the first support portion 300 and the second support portion 310 may be integrally formed, one piece formed, a single composite piece, etc. In some examples, the first support portion 300 and the second support portion 310 may comprise two separate structures that are attached, such as with mechanical fasteners, welding, adhesives, etc.

In an example, the second support portion 310 comprises an intermediate portion 312 and an outer portion 314. The intermediate portion 312 may be attached to the first end 302 of the first support portion 300, and may extend between the first support portion 300 and the outer portion 314. The outer portion 314 may extend substantially parallel to and offset from the first support portion 300. The intermediate portion 312 may extend at an angle with respect to the first support portion 300 and the outer portion 314. In an example, the intermediate portion 312 may define an angle with respect to the first support portion 300 that is between about 20 degrees to about 70 degrees. In an example, the intermediate portion 312 may define an angle with respect to the outer portion 314 that is between about 20 degrees to about 70 degrees. In this way, when the first support portion 300 is attached to the first rack support post 106 of the rack 104, the outer portion 314 of the second support portion 310 may be spaced a distance apart from the first rack support post 106.

The outer portion 314 of the second support portion 310 comprises a first wall 316, a second wall 318, and a third wall 320. The first wall 316 and the second wall 318 may be spaced apart to define a flange opening 322. In an example, the first wall 316 and the second wall 318 may be located at opposing ends of the third wall 320. In this way, the first wall 316 and the second wall 318 may extend substantially parallel to each other, while the first wall 316 and the second wall 318 may extend substantially perpendicular to the third wall 320. The flange opening 322 may therefore be bounded on three sides (e.g., by the first wall 316, the second wall 318, and the third wall 320), while being unbounded opposite the third wall 320. In an example, the first wall 316, the second wall 318, and the third wall 320 are substantially flat/planar and extend linearly.

The adaptor 202 comprises a third support portion 330. The third support portion 330 may be attached to an end (e.g., the second end 304) of the first support portion 300. It will be appreciated that by being attached, the first support portion 300 and the third support portion 330 are not limited to comprising two separate structures that are attached. Rather, in an example, the first support portion 300 and the third support portion 330 may be integrally formed, one piece formed, a single composite piece, etc. In some examples, the first support portion 300 and the third support portion 330 may comprise two separate structures that are attached, such as with mechanical fasteners, welding, adhesives, etc.

The third support portion 330 may extend at an angle with respect to the first support portion 300. In an example, the third support portion 330 may extend substantially perpendicularly with the first support portion 300, so as to define an angle that is about 90 degrees. In other examples, however, the third support portion 330 is not limited to extending perpendicularly, and could instead define an angle with respect to the first support portion 300 that is between about 30 degrees to about 150 degrees. The third support portion 330 may extend between a first end and a second end, wherein the first end is attached to the first support portion 300, and the second end is located a distance away from the first support portion 300.

In an example, the third support portion 330 comprises a fourth wall 332, a fifth wall 334, and a sixth wall 336. Together, the fourth wall 332, the fifth wall 334, and the sixth wall 336 may be spaced apart to define a second flange opening 338. In an example, the fourth wall 332 and the fifth wall 334 may be located at opposing ends of the sixth wall 336. In this way, the fourth wall 332 and the fifth wall 334 may extend substantially parallel to each other, with the fourth wall 332 and the fifth wall 334 extending substantially perpendicular to the sixth wall 336.

In an example, the second flange opening 338 may further be defined by a seventh wall 342 that is spaced a distance apart from the sixth wall 336. The seventh wall 342 may be defined along a side of the first support portion 300, with the seventh wall 342 extending substantially parallel to the sixth wall 336. In an example, the fourth wall 332 and the fifth wall 334 may extend substantially perpendicular to the seventh wall 342. In this way, the second flange opening 338 may be defined at least partially within an end of the first support portion 300 and an end of the third support portion 330. The second flange opening 338 may have a substantially quadrilateral shape, though other shapes (e.g., rounded shapes, etc.) are envisioned.

Figure 4:
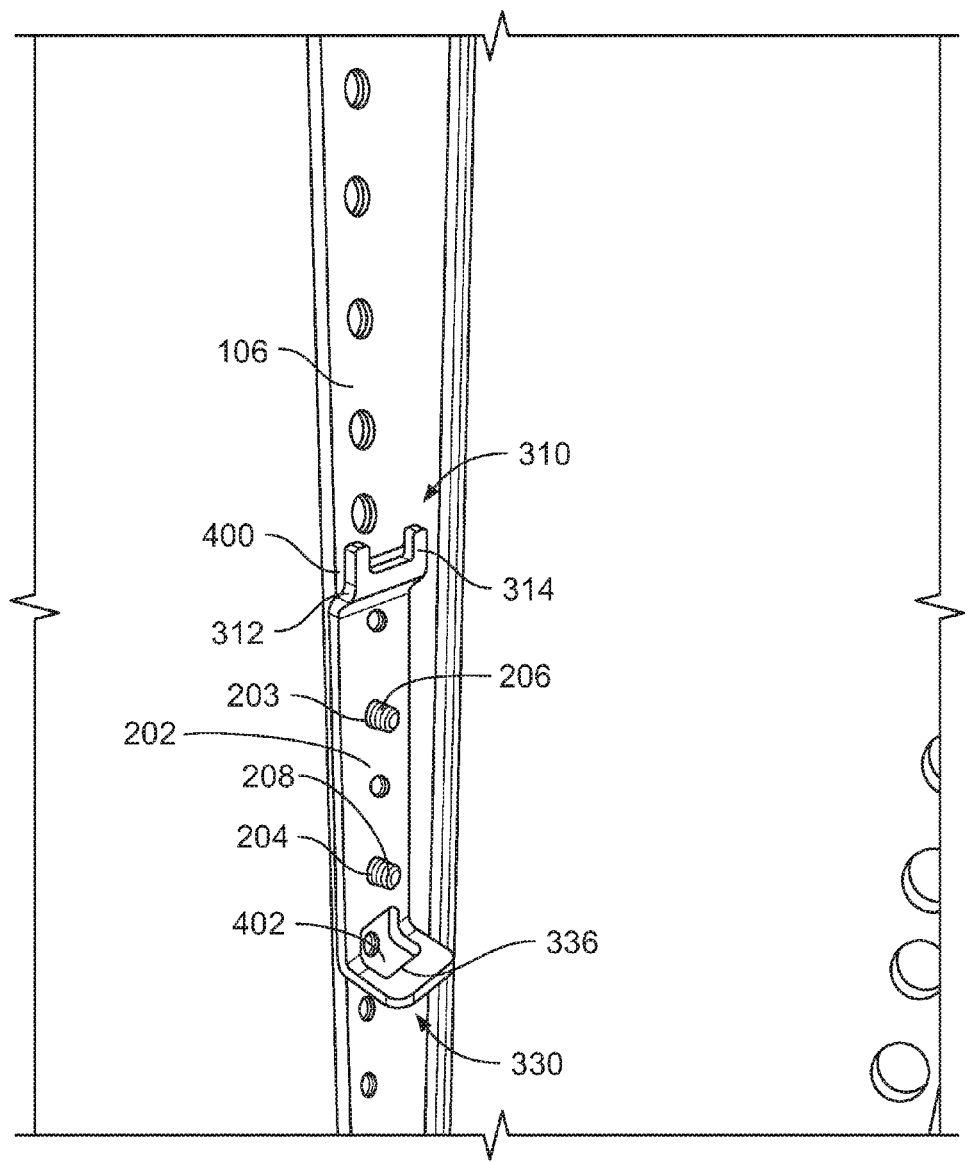
FIG. 4 illustrates an example adaptor attached to a rack support post.

Referring to FIG. 4, the adaptor 202 is illustrated in attachment with the first rack support post 106 of the rack 104. In an example, the first fastener 206 and the second fastener 208 may be received through the rack openings 200 of the first rack support post 106 and through the opening 203 and the second opening 204 of the adaptor 202. The first fastener 206 and the second fastener 208 may be secured and tightened in any number of ways, such as with a threaded nut, or the like. In this way, the adaptor 202 may be maintained in a substantially fixed and non-movable position with respect to the first rack support post 106. The adaptor 202 can also be loosened and removed from the first rack support post 106. For example, the threaded nut may be loosened from the first fastener 206 and the second fastener 208, such that the adaptor 202 can be removed from the first rack support post 106.

The adaptor 202 may define one or more gaps between portions of the adaptor 202 and the first rack support post 106. For example, due to the shape of the intermediate portion 312, the outer portion 314 of the second support portion 310 may be spaced a distance apart from the first rack support post 106 to define a gap 400. In addition, the sixth wall 336 of the third support portion 330 may be spaced a distance apart from the first rack support post 106 to define a second gap 402. In an example, the dimensions of the gap 400 and the second gap 402 may be substantially similar, in that the outer portion 314 of the second support portion 310 and the sixth wall 336 of the third support portion 330 may be spaced a substantially similar or equal distance from the first rack support post 106.

Figure 5:
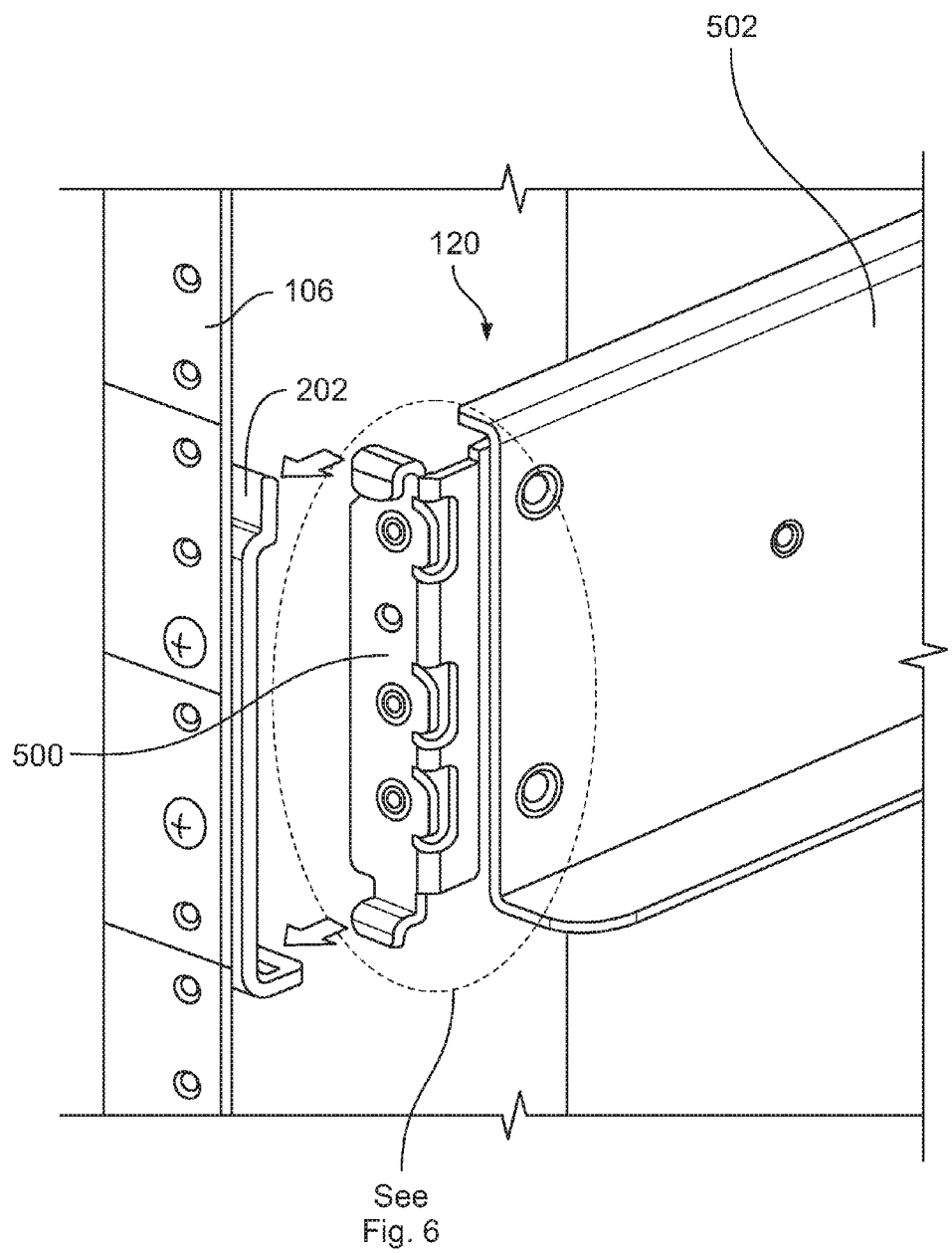
FIG. 5 illustrates an example support arm for attachment to a rack support post via an adaptor.

Referring to FIG. 5, with the adaptor 202 attached to the first rack support post 106 of the rack 104, the support arm 120 may be attached to the adaptor 202. In this way, the support arm 120 may be attached to the first rack support post 106 of the rack 104 via the adaptor 202. In an example, the support arm 120 may comprise a flange 500 and a rail 502, with the flange 500 attached to the adaptor 202.

Figure 6:
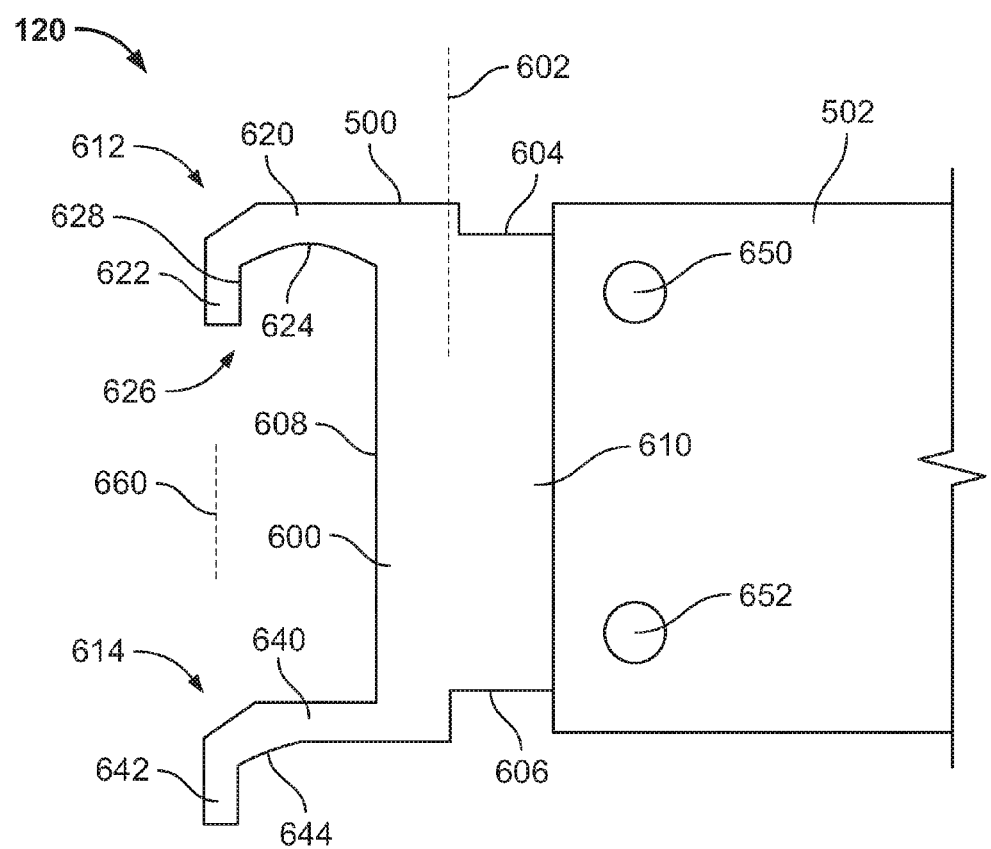
FIG. 6 illustrates an example support arm having a flange and a rail.

Referring to FIGS. 5 and 6, a side view of an end of the support arm 120 is illustrated. In an example, the flange 500 comprises a body portion 600. The body portion 600 may extend along a body axis 602 between a first end 604 and a second end 606. A first side 608 of the body portion 600 may be arranged to face the adaptor 202 while a second side 610 of the body portion 600 may be arranged to face the rail 502.

The flange 500 comprises an attachment portion 612 and a second attachment portion 614. The attachment portion 612 may be attached to the first end 604 of the body portion 600. It will be appreciated that by being attached, the attachment portion 612 and the body portion 600 are not limited to comprising two separate structures that are attached. Rather, in an example, the attachment portion 612 and the body portion 600 may be integrally formed, one piece formed, a single composite piece, etc. In some examples, the attachment portion 612 and the body portion 600 may comprise two separate structures that are attached, such as with mechanical fasteners, welding, adhesives, etc.

The attachment portion 612 comprises one or more attachment walls, such as a first attachment wall 620 and a second attachment wall 622. The first attachment wall 620 may be attached to the first end 604 of the body portion 600 and project from the first side 608. In an example, the first attachment wall 620 may extend non-parallel to the body portion 600. For example, the first attachment wall 620 may extend along a direction that is substantially perpendicular to the body axis 602 of the body portion 600. The first attachment wall 620 may have an inner surface 624 that interfaces with the first side 608 of the body portion 600. In an example, the inner surface 624 may define a non-planar shape, such as a rounded, arched shape, for example.

The second attachment wall 622 may be attached to the first attachment wall 620 opposite the body portion 600. That is, an end of the first attachment wall 620 may be attached to the body portion 600 while an opposing end of the first attachment wall 620 may be attached to the second attachment wall 622. The second attachment wall 622 may extend non-parallel to the first attachment wall 620. The second attachment wall 622 may extend substantially perpendicular to the first attachment wall 620. In an example, the second attachment wall 622 may extend substantially parallel to the body axis 602 along which the body portion 600 extends. The second attachment wall 622 may be spaced apart from the body portion 600 to define an attachment opening 626. In an example, the attachment opening 626 may be defined by the first side 608 of the body portion 600, the inner surface 624 of the first attachment wall 620, and a second inner surface 628 of the second attachment wall 622. In this way, the attachment portion 612, comprising the first attachment wall 620 and the second attachment wall 622, may extend non-linearly from the body portion 600.

The second attachment portion 614 may be attached to the second end 606 of the body portion 600. It will be appreciated that by being attached, the second attachment portion 614 and the body portion 600 are not limited to comprising two separate structures that are attached. Rather, in an example, the second attachment portion 614 and the body portion 600 may be integrally formed, one piece formed, a single composite piece, etc. In some examples, the second attachment portion 614 and the body portion 600 may comprise two separate structures that are attached, such as with mechanical fasteners, welding, adhesives, etc.

The second attachment portion 614 comprises a third attachment wall 640 and a fourth attachment wall 642. The third attachment wall 640 may be attached to the second end 606 of the body portion 600 and project from the first side 608. In an example, the third attachment wall 640 may extend non-parallel to the body portion 600. For example, the third attachment wall 640 may extend along a direction that is substantially perpendicular to the body axis 602 of the body portion 600. In an example, the third attachment wall 640 may extend substantially parallel to the first attachment wall 620. The third attachment wall 640 may have a third inner surface 644 that faces away from the attachment portion 612. In an example, the third inner surface 644 may define a non-planar shape, such as a rounded, arched shape, for example.

The fourth attachment wall 642 may be attached to the third attachment wall 640 opposite the body portion 600. That is, an end of the third attachment wall 640 may be attached to the body portion 600 while an opposing end of the third attachment wall 640 may be attached to the fourth attachment wall 642. The fourth attachment wall 642 may extend non-parallel to the third attachment wall 640. The fourth attachment wall 642 may extend substantially perpendicular to the third attachment wall 640. In an example, the fourth attachment wall 642 may extend substantially parallel to the body axis 602 along which the body portion 600 extends. The fourth attachment wall 642 may be spaced apart from the body portion 600. In this way, the second attachment portion 614, comprising the third attachment wall 640 and the fourth attachment wall 642, may extend non-linearly from the body portion 600. In an example, the second attachment wall 622 and the fourth attachment wall 642 can extend substantially co-axially along an attachment wall axis 660. The attachment wall axis 660 may be parallel to the body axis 602.

The rail 502 may be attached to the body portion 600 of the flange 500. In an example, the rail 502 comprises one or more openings, such as a rail opening 650, a second rail opening 652, etc. The rail opening 650 and the second rail opening 652 may be aligned with openings in the body portion 600 of the flange 500. In this way, the rail opening 650 and an opening in the body portion 600 of the flange 500 may receive a rail fastener, while the second rail opening 652 and a second opening in the body portion 600 of the flange 500 may receive a second rail fastener. As such, the rail fasteners may function to attach the flange 500 to the rail 502. The rail fasteners may be selectively removed, such that the rail 502 may be removably attached to the body portion 600 of the flange 500.

Figure 7:
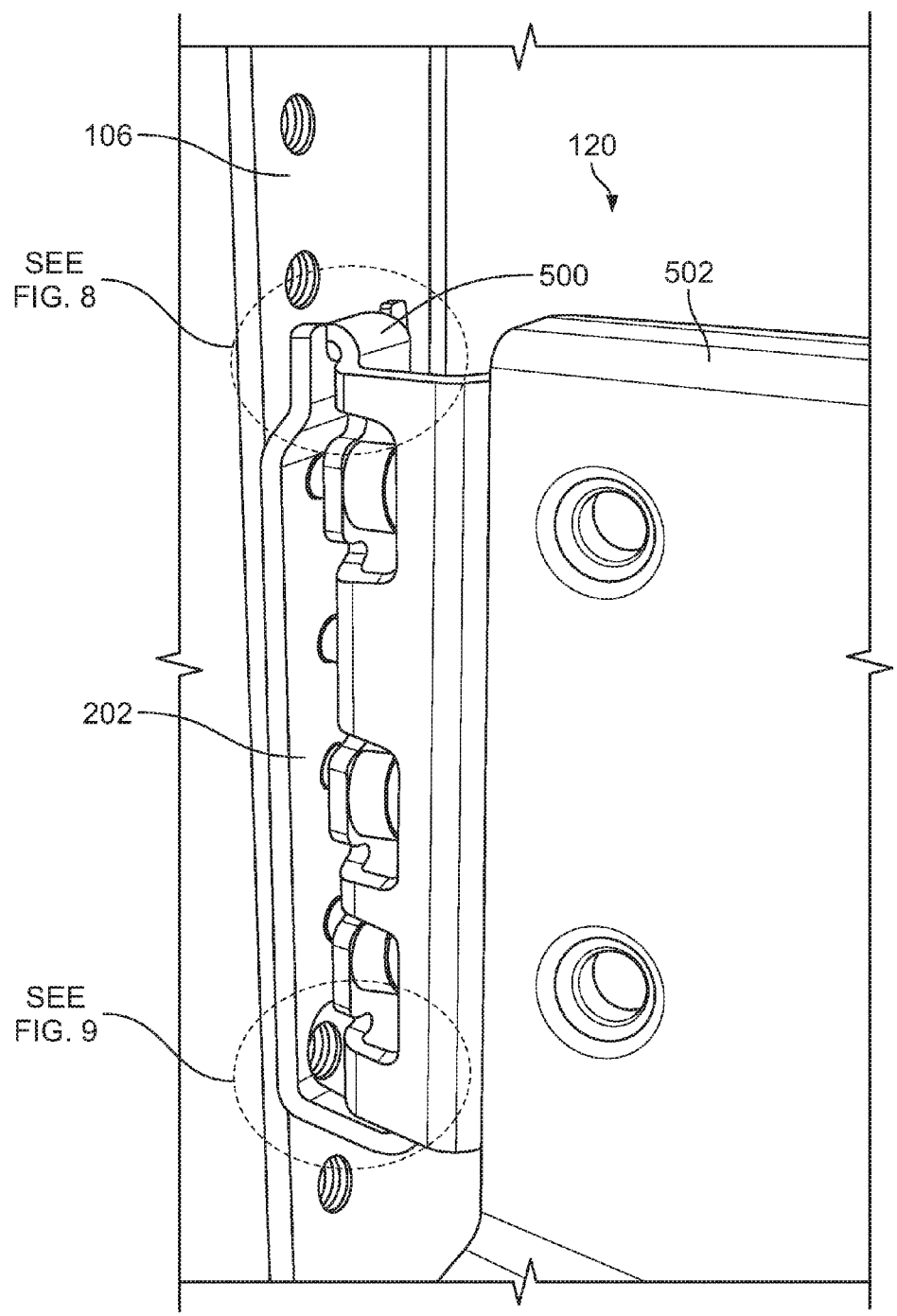
FIG. 7 illustrates an example support arm attached to an adaptor.

Turning to FIG. 7, the support arm 120 may be attached to the rack 104. More particularly, the flange 500 of the support arm 120 may be attached to the adaptor 202, which is attached to the first rack support post 106 of the rack 104. In this way, the flange 500 of the support arm 120 may not be directly attached to the rack 104, such as by being received through the openings in the first rack support post 106. Rather, the flange 500 of the support arm 120 may be indirectly attached to the first rack support post 106 of the rack 104 due to the flange 500 of the support arm 120 being attached to the adaptor 202 and the adaptor 202 being attached to the first rack support post 106 of the rack 104.

Figure 8:
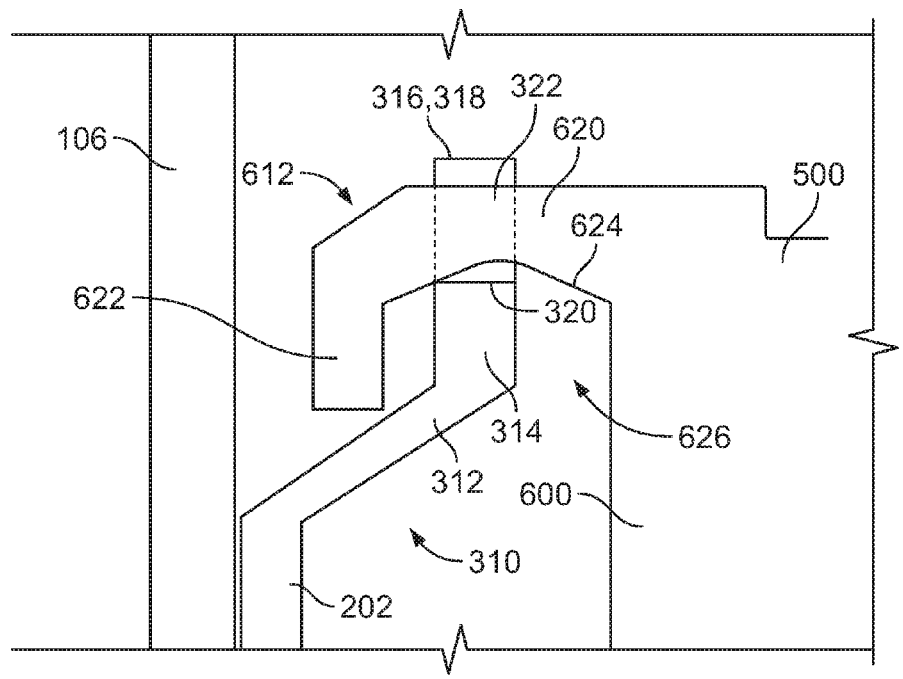
FIG. 8 illustrates a portion of an example flange attached to an adaptor.

Referring to FIG. 8, in an example, the second support portion 310 of the adaptor 202 can receive the attachment portion 612 of the flange 500 of the support arm 120 within the flange opening 322 to attach the support arm 120 to the second support portion 310. For example, the attachment portion 612 of the flange 500 may be received within the flange opening 322 of the second support portion 310 of the adaptor 202. The first attachment wall 620 may be inserted into the flange opening 322 such that the first attachment wall 620 is positioned between the first wall 316 and the second wall 318 (e.g., the first wall and the second wall illustrated in FIG. 3). The inner surface 624 of the first attachment wall 620 may rest upon the third wall 320 of the adaptor 202. In this way, a portion of the adaptor 202 may be disposed within the attachment opening 626 between the second attachment wall 622 of the flange 500, and the body portion 600 of the flange 500. Likewise, in an example, the second attachment wall 622 may be disposed between the outer portion 314 of the second support portion 310 of the adaptor 202 and the first rack support post 106 of the rack 104.

Figure 9:
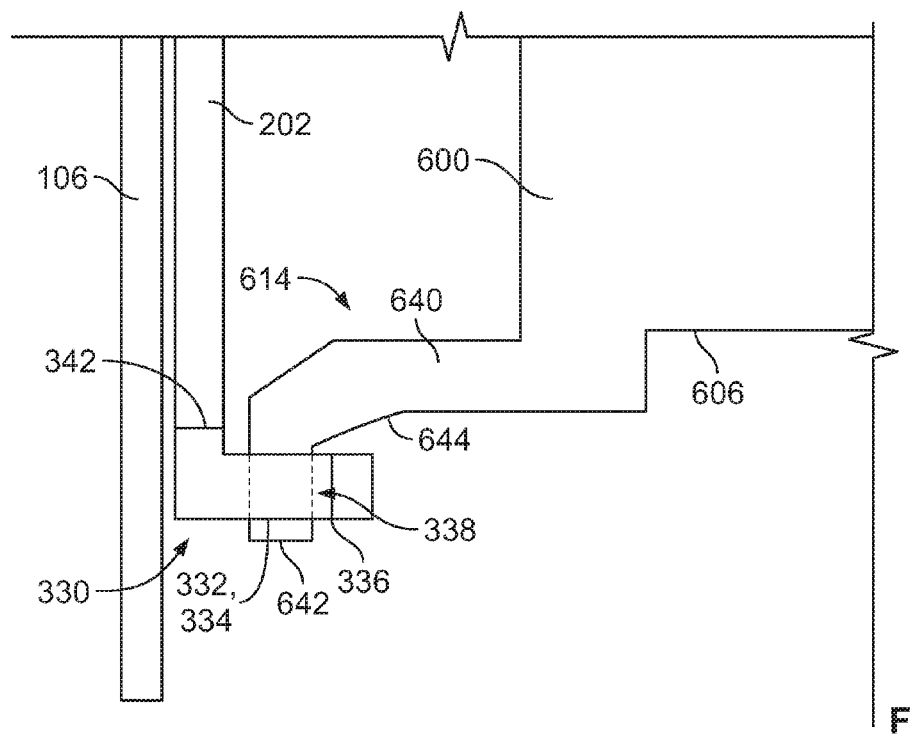
FIG. 9 illustrates a portion of an example flange attached to an adaptor.

Referring to FIG. 9, in an example, the third support portion 330 of the adaptor 202 can receive the second attachment portion 614 of the flange 500 of the support arm 120 within the second flange opening 338 to attach the support arm 120 to the third support portion 330. In an example, the second attachment portion 614 may be received within the second flange opening 338 of the third support portion 330 of the adaptor 202. The fourth attachment wall 642 may be inserted into the second flange opening 338 such that the fourth attachment wall 642 is positioned between the fourth wall 332, the fifth wall 334, the sixth wall 336, and the seventh wall 342 (e.g., illustrated in FIG. 3) of the third support portion 330 that define the second flange opening 338. In an example, the third attachment wall 640 may at least partially rest upon an upper surface of the third support portion 330.

Figure 10:
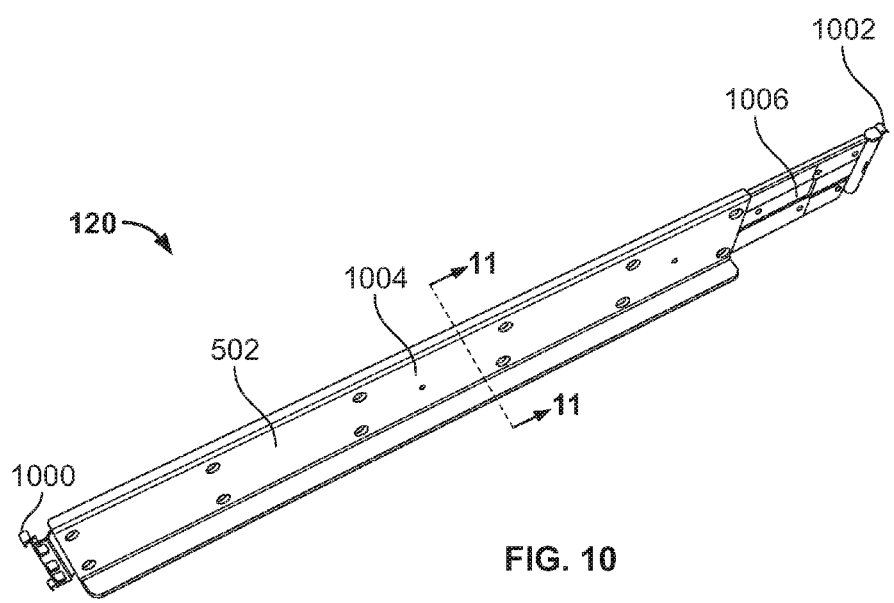
FIG. 10 illustrates an example rail of a support arm.

Referring to FIG. 10, the support arm 120 is illustrated. In an example, the support arm 120 may extend between a first support end 1000 and a second support end 1002. In an example, the first support end 1000 may be attached to the first rack support post 106 via the adaptor 202. In an example, the second support end 1002 may be attached to the third rack support post 110 via an adaptor that is similar to the adaptor 202.

In an example, a length of the support arm 120 (e.g., the rail 502 of the support arm 120) may be adjusted depending on a distance between the rack support posts (e.g., the first rack support post 106 and the third rack support post 110). While any number of structures, constructions, and configurations may be provided to allow for adjustability of the length of the rail 502 of the support arm 120, in an example, the rail 502 comprises a first telescoping portion 1004 and a second telescoping portion 1006. The first telescoping portion 1004 and the second telescoping portion 1006 may be movable with respect to each other to allow for shortening or lengthening of the rail 502 of the support arm 120.

Figure 11:
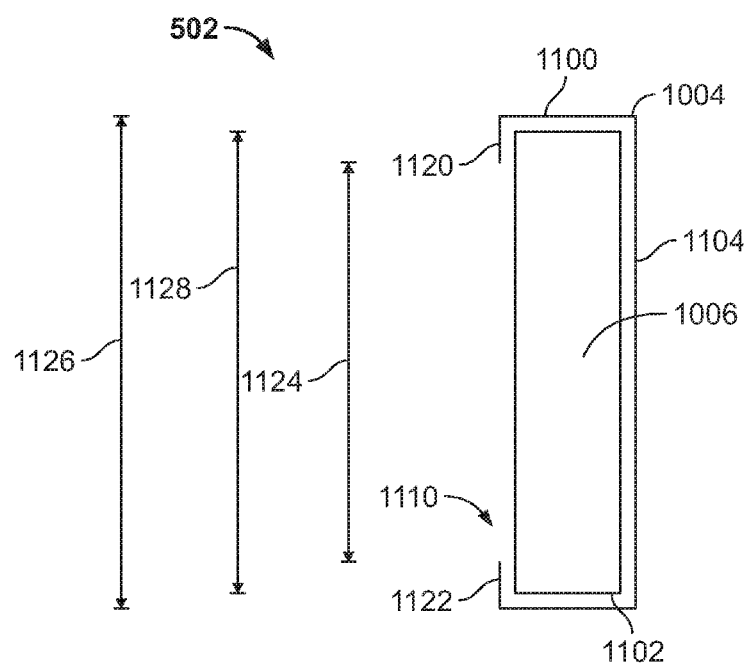
FIG. 11 illustrates a cross-sectional view of an example rail of a support arm.

Referring to FIG. 11, a cross-sectional view of the rail 502 of the support arm 120 as viewed from the perspective 11-11 of FIG. 10 is illustrated. The first telescoping portion 1004 comprises a first telescoping wall 1100, a second telescoping wall 1102, and a third telescoping wall 1104. In an example, the first telescoping wall 1100 and the second telescoping wall 1102 may be spaced apart from one another. The third telescoping wall 1104 may be attached to the first telescoping wall 1100 and the second telescoping wall 1102. For example, an end of the third telescoping wall 1104 may be attached to the first telescoping wall 1100, while a second end of the third telescoping wall 1104 may be attached to the second telescoping wall 1102. In this way, the first telescoping wall 1100, the second telescoping wall 1102, and the third telescoping wall 1104 may define a channel 1110.

The first telescoping wall 1100 may extend substantially perpendicularly with respect to the third telescoping wall 1104. In an example, the first telescoping wall 1100 comprises a first retention member 1120. The first retention member 1120 may be located at an opposite end of the first telescoping wall 1100 from the third telescoping wall 1104. In an example, the first retention member 1120 projects inwardly towards the second telescoping wall 1102, and may extend substantially perpendicularly with respect to the first telescoping wall 1100.

The second telescoping wall 1102 may extend substantially perpendicularly with respect to the third telescoping wall 1104. In an example, the first telescoping wall 1100 and the second telescoping wall 1102 may extend substantially parallel to one another. The second telescoping wall 1102 may comprise a second retention member 1122. The second retention member 1122 may be located at an opposite end of the second telescoping wall 1102 from the third telescoping wall 1104. In an example, the second retention member 1122 projects inwardly towards the first telescoping wall 1100. In this way, a distance 1124 separating the first retention member 1120 and the second retention member 1122 may be less than a second distance 1126 separating the first telescoping wall 1100 and the second telescoping wall 1102.

The second telescoping portion 1006 may be received within the channel 1110 that is defined within the first telescoping portion 1004. The second telescoping portion 1006 comprises any number of cross-sectional shapes and sizes, though in an example, may comprise a quadrilateral shape (e.g., rectangular). In an example, a cross-sectional size 1128 of the second telescoping portion 1006 may be greater than the distance 1124 between the first retention member 1120 and the second retention member 1122, but less than the second distance 1126 between the first telescoping wall 1100 and the second telescoping wall 1102. In this way, the second telescoping portion 1006 may move within the channel 1110 of the first telescoping portion 1004, such as co-axially with respect to the first telescoping portion 1004. However, due to the first retention member 1120 and the second retention member 1122, the second telescoping portion 1006 is limited from inadvertently being removed from the channel 1110.

The first telescoping portion 1004 and the second telescoping portion 1006 can be selectively attached to each other to selectively allow for and prohibit relative movement. For example, fasteners, mechanical locking structures, or the like, can be provided for selectively attaching the first telescoping portion 1004 and the second telescoping portion 1006. In an example, the first telescoping portion 1004 and the second telescoping portion 1006 can be attached together, to limit/reduce movement of the first telescoping portion 1004 and the second telescoping portion 1006 relative to each other. As such, when attached, a length of the rail 502 may be fixed. In an example, due to the fasteners being loosened or removed, movement of the first telescoping portion 1004 and the second telescoping portion 1006 can be provided to allow for a lengthening or a shortening of the rail 502. As such, due to the relative movement of the first telescoping portion 1004 and the second telescoping portion 1006, a length of the rail 502 can be adjusted.

Figure 12:
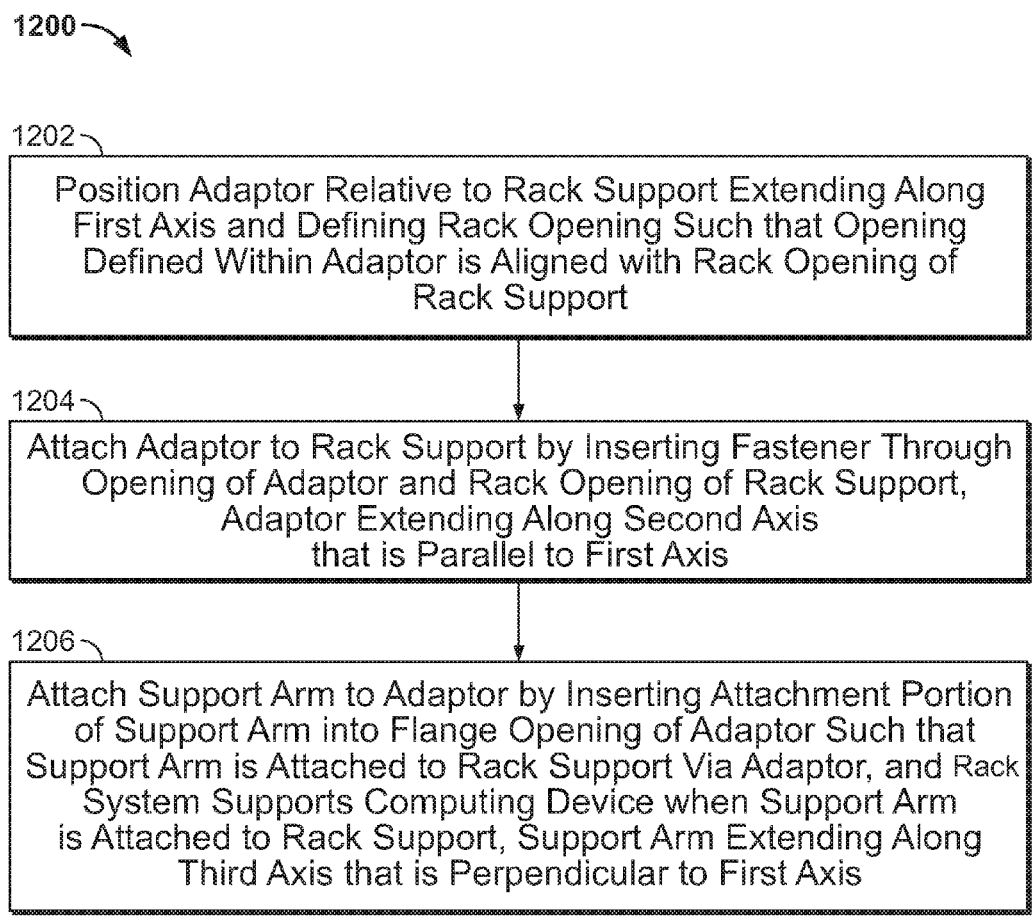
FIG. 12 illustrates an example method for supporting a computing device with a rack system.

Referring to FIG. 12, a method 1200 for supporting a computing device with the rack system 100 is illustrated. At 1202, the method 1200 comprises positioning an adaptor 202 relative to a rack support post 106 extending along a first axis 130 and defining a rack opening 200 such that an opening 203 defined within the adaptor 202 is aligned with a rack opening 200 of the first rack support post 106.

At 1204, the method 1200 comprises attaching the adaptor 202 to the first rack support post 106 by inserting the first fastener 206 through the opening 203 of the adaptor 202 and the rack opening 200 of the first rack support post 106. The adaptor 202 extends along the second axis 201 that is parallel to the first axis 130. At 1206, the method 1200 comprises attaching the support arm 120 to the adaptor 202 by inserting the attachment portion 612 of the support arm 120 into the flange opening 322 of the adaptor 202. As such, the support arm 120 is attached to the first rack support post 106 via the adaptor 202. The rack system 100 supports the computing device when the support arm 120 is attached to the first rack support post 106. The support arm 120 extends along a third axis 121 that may be perpendicular to the first axis 130.

As used in this application, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B and/or both A and B. Furthermore, to the extent that "includes", "having", "has", "with", or variants thereof are used, such terms are intended to be inclusive in a manner similar to the term "comprising".

Many modifications may be made to the instant disclosure without departing from the scope or spirit of the claimed subject matter. Unless specified otherwise, "first," "second," or the like are not intended to imply a temporal aspect, a spatial aspect, an ordering, etc. Rather, such terms are merely used as identifiers, names, etc. for features, elements, items, etc. For example, a first component and a second component generally correspond to component A and component B or two different or two identical components or the same component.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A rack system for supporting a computing device, the rack system comprising:
   an adaptor comprising:
      a first support portion defining an opening that is aligned with a rack opening of a rack support post of a rack, the first support portion and the rack support post configured to abut each other and receive a fastener through the opening of the first support portion and the rack opening to attach the adaptor to the rack support post; and
      a second support portion attached to an end of the first support portion, the second support portion comprising a first wall and a second wall that are spaced apart to define a flange opening, the second support portion defining a support surface that faces the rack support post the rack support post defining a rack surface that faces the second support portion, the support surface and the rack surface spaced apart to define a gap; and
   a support arm comprising:
      a flange comprising a body portion and an attachment portion, the attachment portion configured to be received within the flange opening of the second support portion to attach the support arm to the adaptor; wherein when the attachment portion is received within the flange opening of the second support portion, some of the attachment portion is disposed within the gap and wedged between the support surface and the rack surface;
      and a rail attached to the body portion of the flange, wherein when the adaptor is attached to the rack support post and the attachment portion is received within the flange opening, the rail is configured to be mounted between the rack support post and a second rack support post and is configured to support the computing device.

2. The rack system of claim 1, the adaptor comprising a third support portion attached to a second end of the first support portion, the third support portion comprising a fourth wall and a fifth wall that are spaced apart to define a second flange opening.

3. The rack system of claim 2, the flange comprising a second attachment portion configured to be received within the second flange opening of the third support portion to further secure the support arm to the adaptor.

* * * * *

UNITED STATES PATENT AND TRADEMARK OFFICE
CERTIFICATE OF CORRECTION

| | | |
|---|---|---|
| PATENT NO. | : 9,974,203 B1 | Page 1 of 1 |
| APPLICATION NO. | : 15/349994 | |
| DATED | : May 15, 2018 | |
| INVENTOR(S) | : Ho et al. | |

It is certified that error appears in the above-identified patent and that said Letters Patent is hereby corrected as shown below:

On the Title Page

Insert item (65) Prior Publication Data:
--US 2018/0139863A1  May 17, 2018--

Signed and Sealed this
Twenty-sixth Day of February, 2019

Andrei Iancu
*Director of the United States Patent and Trademark Office*